United States Patent [19]
Blomquist

[11] Patent Number: 5,486,981
[45] Date of Patent: Jan. 23, 1996

[54] HEAT DISSIPATING ASSEMBLY

[75] Inventor: Michael L. Blomquist, Newbury Park, Calif.

[73] Assignee: International Electronic Research Corporation, Burbank, Calif.

[21] Appl. No.: 289,925

[22] Filed: Aug. 12, 1994

[51] Int. Cl.$^6$ ..................... H05K 7/20
[52] U.S. Cl. .................. 361/704; 24/625; 165/80.2; 165/185; 174/16.3; 411/530; 248/505; 257/719; 361/710
[58] Field of Search ............. 24/464, 466, 473, 24/625; 165/80.2, 80.3, 185, 121, 122; 174/16.3; 248/510, 505, 316.7; 257/706–707, 712–713, 718–719, 726–727; 411/352, 516, 522, 523, 530; 439/485; 361/690, 694–697, 704, 707, 709–711, 714–715, 717–719, 722

[56] References Cited

U.S. PATENT DOCUMENTS 4,660,123  4/1987  Herman .................... 361/715
5,208,731  5/1993  Blomquist ................. 361/704
5,276,585  1/1994  Smithers .................. 361/690
5,381,305  1/1995  Harmon et al. ............ 257/718

*Primary Examiner*—Gregory D. Thompson
*Attorney, Agent, or Firm*—Bruce A. Jagger

[57] ABSTRACT

A heat dissipating assembly which is releasably secured in the assembled configuration by means of a spring clip. The spring clip being configured on one end thereof with a lever or rocker arm which permits its assembly or disassembly by hand without the use of any tools. In the disassembly phase the amount of spring tension forcing the spring clip into an engagement with the adjacent structure is greater than the spring force which is required to rotate the latching component out of the latching engagement with the supporting structure. The latching component may thus be held in the rotated configuration out of latching engagement while spring tension moves it out of engaging position.

15 Claims, 3 Drawing Sheets

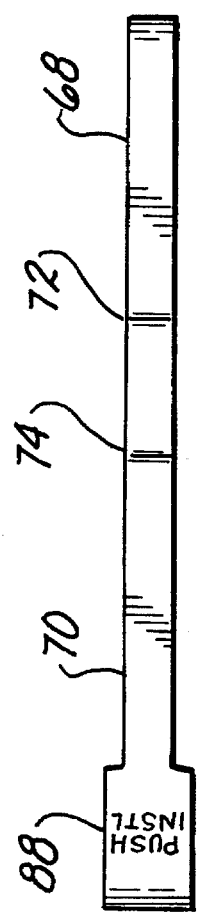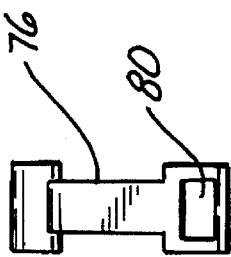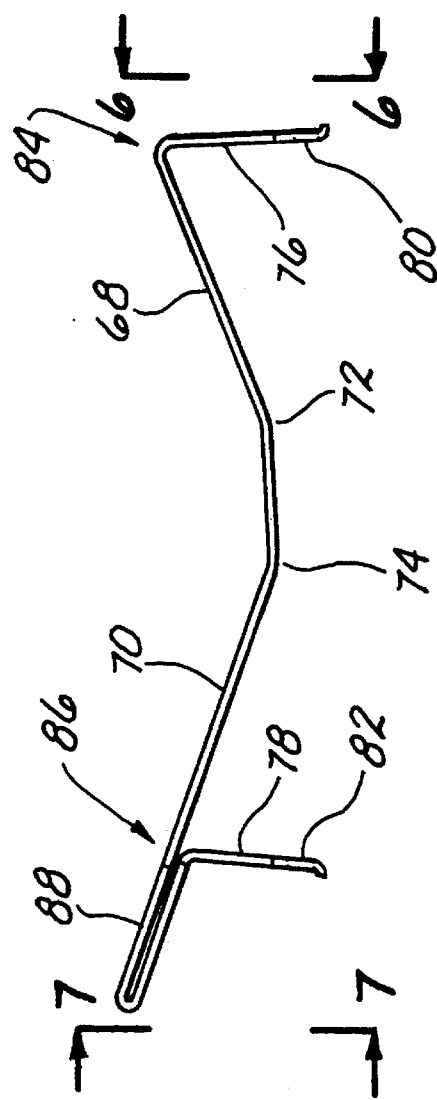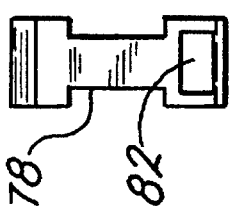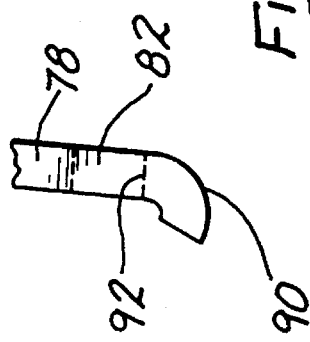

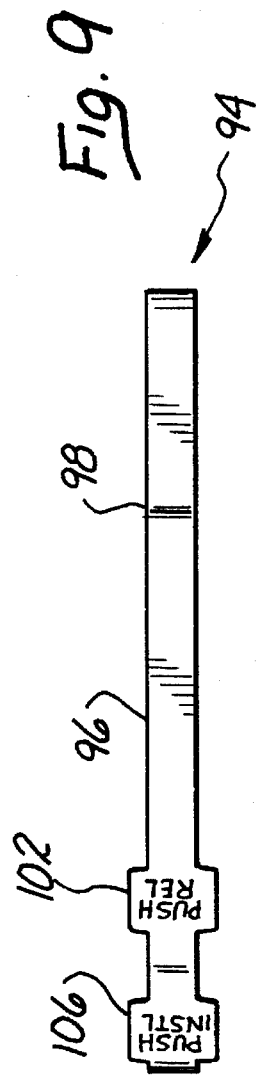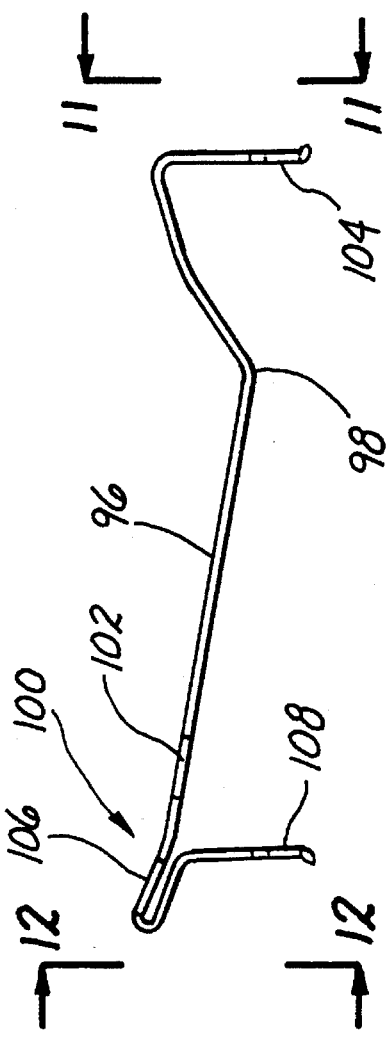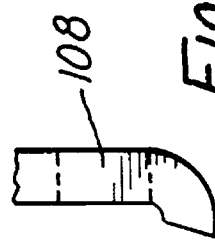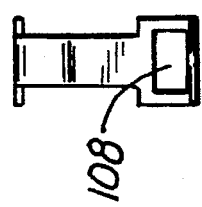

HEAT DISSIPATING ASSEMBLY

BACKGROUND OF THE INVENTION

1. Field of the Invention

The invention relates in general to heat dissipating assemblies and, in particular, to a spring clip for holding a heat dissipating element in heat transfer relationship with a heat generating device such as an electronic chip or package.

2. Description of the Prior Art

Various expedients have been proposed for dissipating heat from electronic devices. One conventional device is that wherein a pinned or finned heat sink is mounted to an electronic device or the socket therefor by means of a releasable spring clip. Such a device is shown, for example, in Blomquist U.S. Pat. No. 5,208,731. Hinshaw U.S. Pat. Nos. 4,884,331 and 4,879,891 are, for example, directed to the details of one form of pinned and finned heat sink.

Means for reliable, accurate and easy attachment of the spring clip to hold the assembly together had generally not been achieved by the prior expedients. Spring clips must be securely mounted to prevent the assembly from becoming dislodged and falling into the circuitry. Electronic devices must be removed and replaced from time to time so it is necessary that the heat dissipating assembly should be easy to remove and install without impairing its reliability or effectiveness. In general, the assembly, disassembly and reassembly of previous heat dissipating assemblies required the use of tools and the possession of some significant degree of skill. Misassembly was generally possible, resulting in malfunctioning units.

These and other difficulties of the prior art have been overcome according to the present invention.

BRIEF SUMMARY OF THE INVENTION

A preferred embodiment of the heat dissipating assembly according to the present invention comprises, for example, a pin grid array heat sink and a spring clip for releasably mounting the heat sink in heat dissipating relationship to an electronic component such as an electronic chip or package. Preferably, the spring clip releasably attaches to a socket for the electronic component so that the heat sink and electronic component are sandwiched between the spring clip and the socket. Generally the electronic component is mounted to the socket, for example, by means of pins. The socket may, however, receive the electronic component in any manner desired. In general the heat sink is formed with a heat receiving face or surface which is adapted to conform generally to a heat emitting surface of the electronic component so that heat flows to the heat sink by conduction. In general the heat sink includes a heat discharging face or surface which is often disposed in a generally opposed position to the heat receiving face or surface of the heat sink. In order to promote the dissipation of heat the heat discharging face or surface of the heat sink is preferably provided with fins or pins which substantially increase the surface area from which heat may be dissipated. Heat dissipation from the heat sink is preferably promoted by flowing a fluid in contacted with the heat discharging surface. Air is the preferred fluid, however, liquid heat exchanger systems may be employed, if desired. The spring clip is so configured that it can be easily and reliably removed and reinstalled by hand without tools and with a minimum of skill and effort.

The spring clip according to the present invention generally comprises an elongated leaf spring which includes several segments. With the heat sink positioned in operative heat receiving position to the electronic component the spring clip is, for example, adapted to extend across the heat sink from one opposed edge thereof to the other and latched in place so that spring bias holds the heat sink tightly in place.

The spring clip is preferably formed into an elongated leaf spring segment which is adapted to extend between the opposed edges of the heat sink so that a first end of the leaf spring segment is generally adjacent one edge of the heat sink and a second end is generally adjacent an opposed edge of the heat sink. According to a preferred embodiment the first and second ends of the elongated leaf spring segment are spaced apart by an amount which is slightly greater than the distance between the opposed edges. The elongated leaf spring segment is preferably generally convex in the direction of the remote terminuses of the legs. Preferably, the leaf spring segment includes a fulcrum location between the first and second ends which bears on the heat dissipating face of the heat sink at one location of very limited area. Because of the angle formed by the preferred fulcrum location the preferred form of the leaf spring segment is generally angularly convex. In a less preferred embodiment the leaf spring segment is generally more arcuately convex with the fulcrum location extending over a larger area. Extending generally between the first end and the fulcrum location is a first leaf spring segment. A second leaf spring segment extends generally between the fulcrum location and the second end.

The spring clip generally includes first and second legs which depend generally from the respective first and second ends of the leaf spring segment. Preferably the legs are connected at the first and second ends through loops of leaf spring material. The loops are generally less flexible than the first and second leaf spring segments. Preferably, the loops are not symmetrical and the loop at the second end performs some functions in addition to transitioning from the second leaf spring segment to the second leg. The legs generally project angularly away from the first and second ends and terminate at locations which are remote from the first and second ends of the leaf spring segment. The remote terminuses of the legs generally include latching elements which are adapted to engage some adjacent structure to hold the assembly together. In general the latching elements preferably engage the socket. If desired, a second angularly concave region or knee can be provided in the elongated leaf spring element. The purpose of such a knee is to stabilize the position of the heat sink by providing a second contact point between the heat sink and the spring clip. Preferably the knee is so formed that in the static assembled configuration the knee is spaced slightly from the heat sink. In this way the knee only touches the heat sink if the heat sink moves slightly, and the spring tension is not influenced by the presence of the knee. With the latching elements engaged in the assembled configuration the fulcrum location bears firmly against the heat sink and there is spring tension in the first leaf spring segment, including the loop at the first end, and in the second leaf spring segment. The load imposed on the heat sink by the spring tension in the spring clip tends to force the heat sink into tight engagement with the electronic component. This spring tension, at least in part, thus tends to act in a direction which is approximately parallel to the legs. The latching elements are preferably configured so that they latch by engaging with undercut projections or bosses on some adjacent structure, such as the socket. The spring tension which is exerted approximately parallel to the legs tends to draw the latching elements into the undercuts so as to prevent their dislodgement. Thus, to disengage the latching elements from the undercut bosses it is necessary to move the legs against the force of the spring tension for a distance sufficient to permit the latching elements to clear the undercuts in the bosses.

In a preferred embodiment the latching elements are in the form of ports formed adjacent the remote terminuses of the legs, and they are adapted to mate with undercut bosses on opposed edges of the socket.

The application of the spring tension in the second loop, if any, is generally more complicated than in the first loop because the second loop is generally involved with a lever member which serves to facilitate the release and engagement of the spring clip.

The spring clip includes, preferably integral therewith, a lever member which, when the spring tensions are properly balanced, permits the spring clip to be repeatedly and reliably removed and reinstalled by hand without tools and with a minimum of effort and skill. The spring clip is configured so that the release and engagement functions are accomplished at the latching element on the second leg. In general the lever member is positioned so that the application of force on one or more locations on the lever member causes the latching element on the second leg to release or engage. Such release or engagement results from the pivoting of the second leg around a general pivot area or location at or generally adjacent to the second end of the second leaf spring segment. Spring tensions in the spring clip are generally balanced so as to facilitate such release or engagement.

In one preferred configuration the lever member is generally "T" shaped with the post or leg of the "T" being formed at least in part by the second leg, and the bar or cross-member extending on either side of the top of the post and being operatively attached thereto so that the application of force to the bar causes the second leg to rotate approximately around the juncture between the top of the post and the bar. The second end of the elongated leaf spring segment is configured so that spring force resists the rotation of the post or leg about this juncture. This anti-rotation spring force acts to prevent the latching element from accidentally rotating out of engagement with the undercut boss with which it is adapted to mate. As described previously, in the assembled configuration, there is a spring tension which tends to act approximately parallel to the legs. This, for convenience of description will be referred to as the "engaging force". To disengage the second latching member from its associated boss, a "disengaging force" is applied to the disengagement end of the bar. Initially the disengaging force acts approximately directly against the engaging force and causes the end of the second leg to move downwardly until the latching element clears the associated undercut boss. Upon disengagement with the boss the disengaging force, by reason of the moment arm which results from applying the disengaging force at some distance from the top of the post causes the leg or post to rotate around a pivot area located approximately at the juncture between the top of the post and the bar in a direction so as to move the latching element away from the associated boss. The amount of disengaging force which is necessary to overcome the anti-rotation force is generally less than the amount of the engaging force so that with the latching element free of the associated boss the leg moves generally parallel to itself away from the boss and the system is disassembled. To accomplish reassembly an "assembly force" is applied to the engagement end of the bar against the disengaging force. The assembly force is sufficient to overcome the engaging force so as to move the latching element towards the associated boss. When the latching element reaches a location where it can engage with the undercut boss, the post rotates approximately about the juncture of the bar and the post so that the terminus of the post or second leg moves towards the boss to bring the latching element into engagement with the undercut boss.

The rotation of the post into a position where it is engaged with the boss can be accomplished by spring tension which is inherent in the spring clip, by the application of a rotational force on the engagement end of the bar acting through a moment arm from the juncture, or by a combination thereof. Where the configuration is such that no rotational force is required to bring the latching element into engagement with the boss, engagement may be accomplished by applying the assembly force approximately at the juncture of the post and bar. In this configuration the engagement arm of the bar is generally only long enough to provide a comfortable place for a person's finger to push against and generally need not be positioned to provide any substantial rotational force to the post.

The disengagement arm can be positioned on either side of the junction between the bar and the post. If the disengagement arm extends generally from the post toward the fulcrum location the disengaging force is generally applied in a direction which is approximately toward the terminus end of the post or second leg. In this configuration both the force to overcome the engaging force and the force to overcome the anti-rotation spring tension are applied at about the same location on the disengaging arm in the same direction. The disengagement arm can be a part of the second leaf spring segment adjacent to the second end or it can be a separate piece attached generally to the post. In a preferred embodiment the lever member comprises a rocker arm which is not a part of the second leaf spring segment between the fulcrum and the second end. The disengagement arm of the rocker arm extends generally from a junction with the post towards the fulcrum location and is spaced from the second leaf spring segment.

If the disengagement arm extends from the post away from the fulcrum location the disengaging force to overcome the engaging force is generally applied in a direction which is approximately toward the terminus end of the post or second leg. The necessary rotational-force, however, is applied in approximately the opposite direction and requires that concurrently the operators thumb or finger be positioned at about the juncture between the post and the bar to serve as a generally fixed point to rotate around.

In general the lever member extends beyond and out of interference with the heat sink. Thus, the lever member is accessible to the operator's fingers. In the configuration where the disengaging arm extends between the second end and the fulcrum location there must be sufficient clearance between the disengaging arm and the heat sink to permit the operator's fingers to reach and manipulate the lever member. This is a more compact configuration than that where the disengaging arm extends from the second end away from the fulcrum location. Where space is at a premium the more compact configuration is preferred.

BRIEF DESCRIPTION OF THE DRAWINGS

Referring particularly to the drawings for the purposes of illustration and not limitation:

FIG. 4 is a plan view of an embodiment of a spring clip wherein the engaging arm projects outwardly from the post.

FIG. 5 is a front elevational view of the spring clip of FIG. 4.

FIG. 6 is a side elevational view of the spring clip of FIG. 5 taken along line 6—6.

FIG. 7 is a side elevational view of the spring clip of FIG. 5 taken along line 7—7.

FIG. 8 is an enlarged front elevational view of the terminus end of the second leg of the spring clip of FIG. 5.

FIG. 9 is plan view of an embodiment of spring clip wherein the disengaging arm extends inwardly from the post.

FIG. 10 is front elevation of the spring clip of FIG. 9.

FIG. 11 is a side elevational view of the spring clip of FIG. 10 taken along line 11—11.

FIG. 12 is a side elevational view of the spring clip of FIG. 10 taken along line 12—12.

FIG. 13 is an enlarged front elevational view of the terminus of the second leg of the spring clip of FIG. 10.

DETAILED DESCRIPTION OF THE PREFERRED EMBODIMENTS

Figure 1:
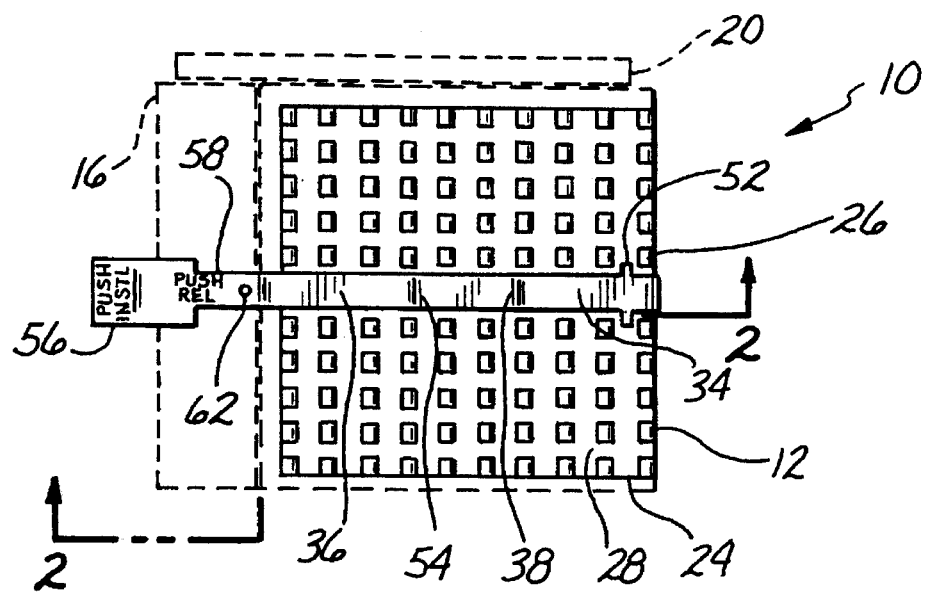
FIG. 1 is a plan view of a preferred embodiment of the invention.

Referring particularly to the accompanying drawings which illustrate the preferred embodiments which have been selected for purposes of illustration, there is illustrated generally at 10 a heat dissipating assembly which includes a heat sink 12, and an electronic chip 14, a chip mounting socket 16, and a spring clip indicated generally at 18.

The socket chosen for the purposes of illustration is a zero insertion force socket which includes a clamp actuating lever arm 20. The rotation of clamp actuating lever arm 20 about pivot mounting 22 serves to clamp the conventional electrically conductive pins of electronic chip 14 into socket 16.

Heat sink 12 includes a base 24. The heat discharging surface 28 of heat sink 12 supports an array of heat dissipating pins, two (2) of which are illustrated at 26. The surface of the base 24 which is opposed to heat discharging surface 28 is mounted in heat receiving relationship with a heat emitting surface of the electronic chip 14. The heat dissipating assembly 10 is held together by means of the spring clip which is indicated generally at 18. As presently contemplated the embodiment of the spring clip indicated at 18 is the best mode of practicing the invention.

Spring clip 18 extends across the heat discharging surface 28 of heat sink 12 from an edge of socket 16 to an opposed edge of socket 16. The opposed edges of socket 16 are provided with bosses, a typical one of which is illustrated at 30. Boss 30 includes an undercut 32, the purpose of which is to enhance the interengagement of spring clip 18 with boss 30.

Spring clip 18 is comprised of an elongated leaf spring segment which includes a first leaf spring segment 34 which extends generally from fulcrum location 38 to a first end which is indicated generally at 40. A second leaf spring segment 36 extends generally from fulcrum location 38 to a second end which is indicated generally at 42. A first leg 44 extends generally angularly from first end 40 and second leg 46 extends generally angularly from second end 42.

The remote terminus end of first leg 44 includes a first latching port 48, and the remote terminus end of second leg 46 includes second latching port 50. These latching ports are designed to engage with boss 30, and particularly undercut 32.

An indexing tab 52 projects from first leaf spring segment 34 in a lateral direction. The purpose of indexing tab 52 is to facilitate the alignment of spring clip 18 with heat sink 12 during the assembly of the heat dissipating assembly 10.

The fulcrum location 38 is preferably formed by a generally angular bend in the elongated leaf spring segment. Fulcrum location 38 bears firmly against the heat discharging surface 28 of heat sink 12 when latching ports 48 and 50 are engaged with their associated respective bosses on opposed edges of socket 16. Between fulcrum location 38 and second end 42 a second generally angular bend is provided in the elongated leaf spring segment and appears as knee 54. The purpose of knee 54 is to provide a second contact location between spring clip 14 and heat discharging surface 28 so that the position of the heat sink relative to the heat emitting surface of electronic chip 14 is stabilized. The base 24 of heat sink 12 is thus prevented from lifting away from the heat emitting surface of electronic chip 14 by reason of base 24 pivoting slightly around fulcrum location 38. Any discontinuity in the physical contact between the heat emitting surface of chip 14 and the heat receiving surface of base 24 will substantially reduce the rate of heat transfer.

A generally "T" shaped lever member is positioned generally at second end 42 to facilitate the release and engagement of spring clip 18 to socket 16. Second leg 46 forms the post or leg portion of the "T" shaped lever member. The spring material from which spring clip 18 is formed is, for example, bent so as to form an engagement arm 56 and a release arm 58. These arms together form a rocker arm member.

Figure 2:
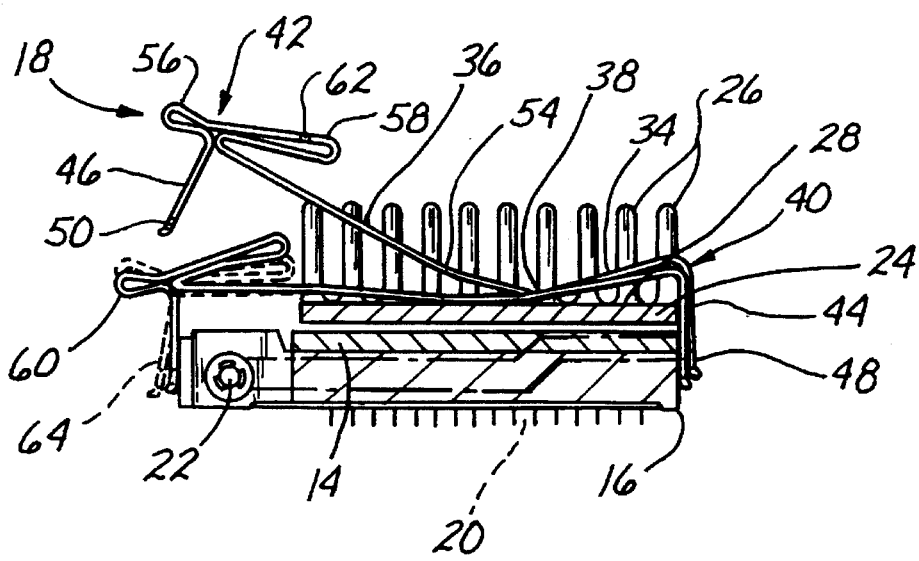
FIG. 2 is a cross-sectional view taken along line 2—2 in FIG. 1.

As is evident, particularly in FIG. 2, there is considerable spring tension in spring clip 18 when it is in the assembled configuration. For ease of description, the first leaf spring segment 34 is said to include a first spring tension. It will be understood by those skilled in the art that the spring tension associated with the first leaf spring segment 34 results from a complex set of forces some of which are in that particular segment, some of which are around fulcrum location 38, some of which are around the spring loop which appears at first end 40 and bridges between segment 34 and leg 44, and possibly other areas in spring clip 18. Likewise, for ease of description, second leaf spring segment 36 is said to include a second spring tension. As will be understood by those skilled in the art, this second spring tension is likewise a combination of very complex forces acting throughout spring clip 18.

The spring material at second end 42 tends to resist the rotation of leg or post 46 around the junction between the end of second leaf spring segment 36 and the attached end of second leg 46. This resistance to the rotation of second leg or post 46 is referred to as anti-rotation spring tension. As will be understood by those skilled in the art, this anti-rotation spring tension is generally the result of a number of interacting factors.

The spring clip 18 is easily installed by positioning the heat sink 12 in the proper location on the heat emitting surface of electronic chip 14. In order to illustrate the assembly of the heat dissipating assembly 10, the base 24 in FIG. 2 is shown spaced from the heat emitting surface of electronic chip 14. As will be understood by those skilled in the art spring clip 18 draws these two (2) surfaces into firm contact when it is fully assembled.

The assembly phase is conveniently initiated by engaging first latching port 48 with an associated latching boss of the type indicated at 30. This results in the partially assembled configuration illustrated in FIG. 2 where the second leg 46 of spring clip 18 is elevated above the heat sink and socket. Pushing downwardly on engagement arm 56 causes leg or post 46 to move downwardly until second latching port 50 engages with an associated boss on the opposed edge of socket 16. In the fully assembled configuration the latching ports 48 and 50 are engaged are drawn upwardly firmly into undercuts, typical one which is illustrated at 32. The combination of at least the first and second spring tensions pulls the latching ports in a direction approximately parallel to their associated legs and normally upwardly towards heat sink 12.

In the fully latched configuration engagement arm 56 occupies the position indicated generally at 60. When it is desired to disassemble the heat dissipating assembly 10, pressure is applied to release arm 58 in a normally downwardly direction at approximately the location of hole 62. The amount of force applied to release arm 58 must be sufficient to overcome the second spring tension in the second leaf spring element and to cause the pivoting or rotation of second leg or post 46 approximately around the junction between the post and the second leaf spring segment. As the second latching port 50 disengages from its associated boss, post 46 moves to the location generally indicated in phantom at 64. The amount of force which must be applied to release arm 58 in order to maintain leg 46 in the rotated position indicated at 64 is less than the second spring tension. Thus, the second spring tension moves the second latching port 50 out of a position where it could reengage with boss 30 before leg 46 rotates back to the position where the anti-rotation spring tension normally holds it.

Reapplication of the spring clip is readily accomplished by applying downward force on engagement arm 56. In general it is not necessary to apply enough force on engagement arm 56 to cause leg 46 to rotate normally inwardly against the anti-rotation spring force. Hole 62 is provided in release arm 58 so that if desired the tip of a conventional ball point pen may be inserted in the hole and used to apply the downward force which is necessary to accomplish disengagement. This is useful, for example, when the assembly is too hot to touch. In this preferred embodiment the release arm 58 generally extends from approximately second end 42 towards fulcrum location 38 and is separate from second leaf spring segment 36. Thus, the application of force to release arm 58 causes the arm and post 46 to rock or pivot so as to accomplish the desired disengagement.

In the embodiment illustrated particularly in FIGS. 4 through 8 a spring clip indicated generally at 66 includes a first leaf spring segment 68, a second leaf spring segment 70 and fulcrum and knee locations 72 and 74, respectively. First and second legs 76 and 78, respectively, depend from first and second ends 84 and 86, respectively. The terminus end of first leg 76 includes first latching port 80 and the terminus end of second leg 78 includes second latching port 82. A lever arm 88 projects outwardly from post or second leg 78 away from fulcrum location 72.

Figure 3:
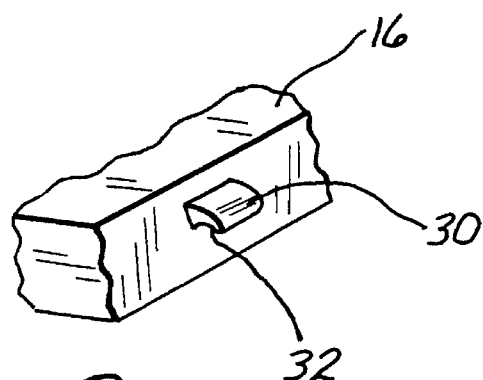
FIG. 3 is a broken perspective view of an edge of a socket including a boss.

During installation spring clip 66 is positioned with first latching port 80 over an associated boss, a typical one which is indicated at 30 in FIG. 3. Fulcrum location 72 is brought into contact with the heat dissipating surface of a heat sink and normally downwardly applied force is exerted on approximately lever arm 88 so as to move second leg or post 78 down into a position where engagement with port 82 and an associated boss is possible.

Attention is invited particularly to FIGS. 3 and 8. The arcuate area 90 of second leg 78 is designed to slide smoothly over the normally upper surface of boss 30 until the lower edge of the boss reaches the lower edge 92 of port 82. Second leg 78 snaps under the force of spring tension in a direction so as to bring the lower edge 92 of second latching port 82 into engagement with undercut 32. In order to release the interengagement between the boss and the latching port it is necessary to apply generally downwardly directed force approximately parallel to the second leg 78 while rotating the leg so as to move lower edge 92 out of engagement with undercut 32.

Referring particularly to FIGS. 9 through 13 there is indicated generally at 94 a spring clip in which the release arm is integral with the second leaf spring segment 96 and is located intermediate the fulcrum location 98 and the second end which is indicated generally at 100. The application of force to release pad 102 acts in a somewhat similar fashion as does the application of force to release arm 58 as illustrated for example in FIG. 2. The installation of spring clip 94 is accomplished by placing first latching port 104 over an associated post on an opposed side of a socket or other adjacent structure. Normally downwardly directed force is then applied to engagement arm 106 to cause the second leg to move down until second latching port 108 is brought into engaging relationship with an associated boss. The elongated leaf spring segment according to this embodiment does not include a knee location.

As will be understood by those skilled in the art, the release and engagement arms while being generally "T" shaped may be arcuate or angular, and the post member may be arcuate or angular and may be composed of one or more pieces. The rotation and pivot of the post or second leg will be understood as not occurring exactly around a fixed point but rather around a region which may fall in empty space or within the material of the spring clip.

What has been described are preferred embodiments in which modifications and changes, substitutions and reversals may be made without departing from the spirit and scope of the accompanying claims.

What is claimed is:

1. A spring clip element for use in a heat dissipating assembly which includes a heat conductive body including a heat receiving surface adapted to be mounted in heat receiving relationship with a heat emitting surface of an electronic component and a heat discharging surface generally opposed to said heat receiving surface, said spring clip element being adapted to removably hold the heat conductive body in assembled configuration with the electronic component, said spring clip element comprising:

a generally elongated leaf spring segment normally having spring tension therein and having
a first end,
a second end,
a fulcrum location between said first and second ends,
a first leaf spring segment normally having a first spring tension therein,
a second leaf spring segment normally having a second spring tension therein,
said second end including generally a pivot location and normally having anti-rotation spring tension therein, and a first leg element depending generally from said first end,
a second leg element depending generally from said second end, said first leaf spring segment extending generally between said fulcrum location and said first leg element, and said second leaf spring segment extending generally between said fulcrum location and said second leg element, said second leg element forming a post of a lever member, a bar member forming a cross piece of said lever member, said bar member including a release arm and an engagement arm, said bar member being adapted to cause said second leg element to rotate generally around said pivot location against the anti-rotation spring tension responsive to force applied to said bar member.

2. A spring clip element of claim 1 wherein said release and engagement arms are of different lengths and said release arm is separate from said second leaf spring segment.

3. A spring clip element of claim 1 wherein said bar member includes a release arm extending generally from said second end towards said fulcrum location.

4. A spring clip element for use in a heat dissipating assembly which includes a heat conductive body including a heat receiving surface adapted to be mounted in heat receiving relationship with a heat emitting surface of an electronic component and a heat discharging surface generally opposed to said heat receiving surface, said spring clip element being adapted to removably hold the heat conductive body in assembled configuration with the electronic component, said spring clip element comprising:

a generally elongated leaf spring segment normally having spring
tension therein and having
a first end,
a second end,
a fulcrum location between said first and second ends,
a first leaf spring segment normally having a first spring tension therein,
a second leaf spring segment normally having a second spring tension therein,
said second end including generally a pivot location and
normally having anti-rotation spring tension therein, and a first leg element depending generally from said first end, a second leg element depending generally from said second end, said first leaf spring segment extending generally between said fulcrum location and said first leg element, and said second leaf spring segment extending generally between said fulcrum location and said second leg element, said second leg element forming a post of a lever member, a bar member forming a cross piece of said lever member, said bar member including a release arm extending generally from said second end away from said fulcrum location, said bar member being adapted to cause said second leg element to rotate generally around said pivot location against the anti-rotation spring tension responsive to force applied to said bar member.

5. A spring clip element of claim 4 wherein said second end of said leaf spring segment is formed into said lever member.

6. A spring clip element of claim 4 wherein said bar member includes a release arm and an engagement arm and the anti-rotation spring tension is less than the second spring tension.

7. A spring clip element of claim 4 wherein said lever member comprises a generally T-shaped member and said bar member includes a release arm and an engagement arm.

8. A spring clip element of claim 4 wherein said fulcrum location is adapted to bear against said heat discharging surface, and said second leaf spring segment includes a knee location spaced from said fulcrum location, said knee location being adapted to stabilize said heat conductive body.

9. A spring clip element of claim 4 including an indexing element adapted to index the spring clip element to the heat conductive body.

10. A spring clip element for use in a heat dissipating assembly which includes an electronic socket member having generally opposed edges and opposed faces, said electronic socket member being adapted to mount an electronic component on one of said faces, a heat conductive body including a heat receiving surface adapted to be mounted in heat receiving relationship with a heat emitting surface of said electronic component and a heat discharging surface generally opposed to said heat receiving surface, said spring clip element adapted to removably hold the heat conductive body in assembled configuration with the electronic socket member and the electronic component, said spring clip element comprising:

a generally elongated leaf spring segment having first and second ends and a fulcrum location between said first and second ends, a first leg element depending generally from said first end, a second leg element depending generally from said second end, a first leaf spring segment extending generally between said fulcrum location and said first leg element, a second leaf spring segment extending generally between said fulcrum location and said second leg element, said second end including generally a pivot location, a rocker arm member having a release arm and an engagement arm, said rocker arm member being operatively associated with said second leg element and adapted to cause said second leg element to rotate generally around said pivot location against anti-rotation spring tension in said clip element responsive to force applied to said rocker arm member, said first and second leg elements including first and second releasable socket member engagement parts, respectively, said first leaf spring element adapted to apply a first latching spring tension to bias said first releasable socket member engagement part into latching engagement with said socket member, said second leaf spring segment adapted to apply a second latching spring tension to bias said second releasable socket member engagement part into latching engagement with said socket member, whereby the application of force on said engagement arm moves said second releasable socket engagement part into latching engagement with said socket member and the application of force on said release arm moves said second releasable socket engagement part out of latching engagement with said socket member.

11. A spring clip of claim 10 wherein said second end of said generally elongated leaf spring segment is formed into said rocker arm member.

12. A spring clip element for use in a heat dissipating assembly which includes an electronic socket member adapted to mount an electronic component thereon, a heat conductive body including a heat receiving surface adapted to be mounted in heat receiving relationship with a heat emitting surface of said electronic component and a heat discharging surface generally opposed to said heat receiving surface, said spring clip element adapted to removably hold the heat conductive body in assembled configuration with the electronic socket member and the electronic component, said spring clip comprising:

a generally elongated leaf spring segment normally having spring tension therein and having
a first end,
a first leg element depending generally from said first end,
a second end,
a second leg element depending generally from said second end, and
a fulcrum location between said first and second ends,
a first leaf spring segment extending generally between said fulcrum location and said first leg element and normally having a first spring tension therein,
a second leaf spring segment extending generally between said fulcrum location and said second leg element and normally having a second spring tension therein,
said second end including generally a pivot location and normally having anti-rotation spring force therein,
a rocker arm member generally integral with said second leaf spring segment and having
a release arm and
an engagement arm, said release arm being separate from said
second leaf spring segment,
said rocker arm member being operatively associated with said second leg element and adapted to cause said second leg element to rotate generally around said pivot location against the anti-rotation spring tension in said clip element responsive to force applied to said rocker arm member.

13. The spring clip element of claim 12 wherein the second spring tension is greater than the anti-rotation spring tension.

14. The spring clip element of claim 12 wherein said engagement arm extends generally from said second end towards said fulcrum location generally along said second leaf spring segment.

15. The spring clip element of claim 12 wherein said release and engagement arms are of different lengths.

* * * * *